United States Patent
Lee et al.

(10) Patent No.: US 11,437,410 B2
(45) Date of Patent: Sep. 6, 2022

(54) DISPLAY APPARATUS AND MANUFACTURING METHOD FOR THE SAME

(71) Applicant: SAMSUNG ELECTRONICS CO., LTD., Suwon-si (KR)

(72) Inventors: Chang Joon Lee, Suwon-si (KR); Kyung Woon Jang, Suwon-si (KR); Chang Kyu Chung, Suwon-si (KR); Young Jun Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/545,556

(22) Filed: Aug. 20, 2019

(65) Prior Publication Data
US 2020/0105792 A1 Apr. 2, 2020

(30) Foreign Application Priority Data
Oct. 1, 2018 (KR) .................. 10-2018-0117088

(51) Int. Cl.
*H01L 27/32* (2006.01)
*H01L 27/12* (2006.01)

(52) U.S. Cl.
CPC ........ *H01L 27/124* (2013.01); *H01L 27/1259* (2013.01)

(58) Field of Classification Search
CPC .. H01L 27/124; H01L 25/167; H01L 25/0753
See application file for complete search history.

(56) References Cited

U.S. PATENT DOCUMENTS

| | | | |
|---|---|---|---|
| 2007/0091602 A1* | 4/2007 | van Voorst Vader | G03B 15/05 362/11 |
| 2008/0266827 A1 | 10/2008 | Yokozawa | |
| 2014/0240375 A1* | 8/2014 | Ha | G09G 3/32 345/82 |
| 2014/0252982 A1* | 9/2014 | Schmitz | B64F 1/20 315/291 |
| 2016/0351092 A1* | 12/2016 | Chen | G09G 3/3233 |
| 2017/0207284 A1* | 7/2017 | Dykaar | H01L 51/5237 |
| 2018/0160506 A1* | 6/2018 | Tsai | H05B 47/20 |
| 2018/0211582 A1 | 7/2018 | Sakariya et al. | |
| 2018/0242422 A1* | 8/2018 | Choi | H05B 45/20 |

(Continued)

FOREIGN PATENT DOCUMENTS

| | | | |
|---|---|---|---|
| JP | 2013110206 A | * | 6/2013 |
| KR | 10-2008-0080366 A | | 9/2008 |

(Continued)

OTHER PUBLICATIONS

International Search Report (PCT/ISA/210) dated Dec. 24, 2019 issued by the International Searching Authority in counterpart International Application No. PCT/KR2019/010481.

(Continued)

*Primary Examiner* — Michele Fan
(74) *Attorney, Agent, or Firm* — Sughrue Mion, PLLC (57) ABSTRACT

A display apparatus includes a plurality of inorganic light emitting diodes (LEDs) configured to form a single pixel, a plurality of signal electrodes configured to supply a data signal to the plurality of inorganic LEDs, and a common electrode configured to provide a ground to the plurality of inorganic LEDs.

10 Claims, 10 Drawing Sheets

(56) References Cited

U.S. PATENT DOCUMENTS

| | | | | |
|---|---|---|---|---|
| 2018/0292073 A1* | 10/2018 | Mattila | ................... | F21V 19/04 |
| 2018/0350291 A1* | 12/2018 | Wu | ........................... | G09G 3/32 |
| 2018/0374415 A1* | 12/2018 | Morita | ................ | H01L 27/1251 |
| 2019/0005870 A1* | 1/2019 | Son | ....................... | H01L 25/167 |
| 2019/0057978 A1* | 2/2019 | Kim | .................... | H01L 51/5203 |
| 2019/0287949 A1* | 9/2019 | Chong | ................. | G09G 3/2003 |
| 2020/0194406 A1* | 6/2020 | Liu | ..................... | H01L 25/0753 |
| 2020/0202769 A1* | 6/2020 | Yang | ........................ | G09G 3/32 |

FOREIGN PATENT DOCUMENTS

| | | | |
|---|---|---|---|
| KR | 101295342 B1 * | 8/2013 | ............ G09G 3/006 |
| KR | 10-2017-0049117 A | 5/2017 | |
| KR | 10-2017-0101056 A | 9/2017 | |
| KR | 20170101056 A * | 9/2017 | |
| KR | 10-1789145 B1 | 10/2017 | |
| KR | 10-2018-0071743 A | 6/2018 | |
| WO | 2017/061226 A1 | 4/2017 | |

OTHER PUBLICATIONS

Communication dated Jul. 29, 2021 by the European Patent Office in European Patent Application No. 19869586.8.

* cited by examiner

DISPLAY APPARATUS AND MANUFACTURING METHOD FOR THE SAME

CROSS-REFERENCE TO RELATED APPLICATION(S)

This application is based on and claims priority under 35 U.S.C. § 119 to Korean Patent Application No. 10-2018-0117088, filed on Oct. 1, 2018, in the Korean Intellectual Property Office, the disclosure of which is incorporated by reference herein in its entirety.

BACKGROUND

1. Field

Embodiments of the disclosure relate to a display apparatus displaying an image by using an inorganic light emitting diode and a manufacturing method thereof.

2. Description of Related Art

A display apparatus is a display device that converts electrical information into visual information and displays the visual information to a user. The display apparatus may include a television and a monitor, well as a portable device such as a notebook PC, a smart phone, and a tablet PC.

The display apparatus may include a non-self-emissive display panel such as a liquid crystal display (LCD), and a self-emissive display panel that generates light corresponding to a data signal.

Particularly, an inorganic light emitting diode (LED) has been actively studied for implementation in the self-emissive display panel. An inorganic LED is a device for converting an electrical signal into light, such as infrared rays and visible light, by using the characteristics of compound semiconductors. The inorganic LED is used for home appliances, remote controls, electronic boards, and a variety of automation. In addition, the inorganic LED has been widely used for small hand-held electronic devices and large-size display apparatuses.

SUMMARY

Therefore, an aspect of the disclosure provides a display apparatus capable of providing a signal electrode supplying a data signal and common electrode capable of providing a ground, and a manufacturing method thereof.

Additional aspects of the disclosure will be set forth in part in the description which follows and, in part, will be apparent from the description, or may be learned by practice of the disclosure.

In accordance with an aspect of the disclosure, there is provided a display apparatus including a plurality of inorganic light emitting diodes included in a single pixel region, a plurality of signal electrodes comprising a first signal electrode, a second signal electrode and a third signal electrode, and configured to supply data signals to the plurality of inorganic light emitting diodes, and a common electrode configured to provide a ground to the plurality of inorganic light emitting diodes, wherein the first signal electrode is arranged above an upper side of the common electrode, and the second signal electrode and the third signal electrode are arranged below a lower side of the common electrode.

Each of the plurality of inorganic light emitting diodes having different color region may be connected to different signal electrodes, respectively, and the plurality of signal electrodes and the common electrode may comprise replaceable regions of the plurality of inorganic light emitting diodes.

The second signal electrode may be arranged on a left side of the single pixel region and third signal electrode may be arranged on a right side of the single pixel region, and the common electrode may be arranged between the first signal electrode and the third signal electrode.

The plurality of signal electrodes may have same horizontal length each other.

A horizontal length of the common electrode may be at least two times greater than the horizontal length of the signal electrode.

A vertical width of the common electrode may be at least two times greater than a vertical width of the signal electrode.

The plurality of inorganic light emitting diodes, the plurality of signal electrodes, and the common electrode may be included in the single pixel region.

The single pixel region may include a single common electrode, and the single pixel region may be composed of a pair of red inorganic light emitting diodes, a pair of blue inorganic light emitting diodes, and a pair of green inorganic light emitting diodes.

The display apparatus may further include a substrate including a plurality of scan lines and a plurality of data lines are provided on one surface of the substrate.

The plurality of inorganic light emitting diodes, the plurality of signal electrodes, and the common electrode may be included in the single pixel region.

The single pixel region may include a plurality of sub-pixel regions formed at intersections of the plurality of scan lines and the plurality of data lines.

The plurality of inorganic light emitting diodes may be bonded to the plurality of signal electrodes and the common electrode.

The single pixel region may include three sub-pixel regions adjacent to each other, and the sub-pixel regions may be composed of a pair of red inorganic light emitting diodes, a pair of blue inorganic light emitting diodes, and a pair of green inorganic light emitting diodes, respectively.

In accordance with another aspect of the disclosure, there is provided a manufacturing method of a display apparatus including arranging a plurality of signal electrodes comprising a first signal electrode, a second signal electrode and a third signal electrode, and a common electrode on a substrate, and connecting an anode of a plurality of inorganic light emitting diodes and a cathode of the plurality of inorganic light emitting diodes included in a single pixel region to the plurality of signal electrodes and the common electrode, respectively, and the plurality of signal electrodes supplies data signals to the plurality of inorganic light emitting diodes, and the common electrode provides a ground to the plurality of inorganic light emitting diodes and the arranging of a plurality of signal electrodes may include arranging the first signal electrode above an upper side of the common electrode, and arranging the second signal electrode and the third signal electrode below a lower side of the common electrode.

The connecting may include connecting each of the plurality of inorganic light emitting diodes having different color region to different signal electrodes, respectively, and the arranging of a plurality of signal electrodes may further include providing replaceable regions of the plurality of inorganic light emitting diodes on the plurality of signal electrodes and the common electrode.

Arranging the second signal electrode and the third signal electrode may include arranging the second signal electrode on a left side of the single pixel region and arranging third signal electrode on a right side of the single pixel region.

Arranging may include arranging the common electrode between the first signal electrode and the third signal electrode.

The plurality of signal electrodes may have same horizontal length each other.

A horizontal length of the common electrode may be at least two times greater than the horizontal length of the signal electrode.

A vertical width of the common electrode may be at least two times greater than a vertical width of the signal electrode.

The plurality of inorganic light emitting diodes, the plurality of signal electrode, and the common electrode may be included in the single pixel region.

In accordance with another aspect of the disclosure, there is provided a display module includes a plurality of inorganic light emitting diodes including a pair of red inorganic light emitting diodes, a pair of blue inorganic light emitting diodes, and a pair of green inorganic light emitting diodes, a signal electrode configured to supply data signals to the pair of red inorganic light emitting diodes, the pair of blue inorganic light emitting diodes, and the pair of green inorganic light emitting diodes, and a plurality of common electrodes configured to provide a ground to the plurality of inorganic light emitting diodes, and each of the plurality of common electrodes may be connected to the pair of red inorganic light emitting diodes, the pair of blue inorganic light emitting diodes, and the pair of green inorganic light emitting diodes, respectively.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Embodiments described in the disclosure and configurations shown in the drawings are merely examples of the embodiments of the disclosure. It will be evident to the artisan of ordinary skill to which the disclosure pertains that the embodiments may be modified in various different ways.

The terms used herein are selected to describe the embodiments and are not intended to limit or restrict the disclosure.

The singular forms "a," "an" and "the" are intended to include the plural forms as well, unless the context in the disclosure clearly indicates otherwise.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms.

In addition, terms such as "unit", "part", "block", "member", and "module" indicate a unit for processing at least one function or operation, and the terms may represent at least one hardware such as Field Programmable Gate Array (FPGA), Application Specific Integrated Circuit (ASIC), at least one software stored in a memory, or at least one process processed by a processor.

The disclosure will be described more fully hereinafter with reference to the accompanying drawings. Like reference numerals in the drawings refer to like elements throughout the description. Well-known functions or constructions are not described in detail to avoid obscuring the embodiments with unnecessary detail.

Hereinafter a display apparatus represents any apparatus capable of providing an image to a user by displaying the image. For example, the display apparatus may include a television, a monitor, a laptop computer and a display device of a mobile communication terminal.

Figure 1:
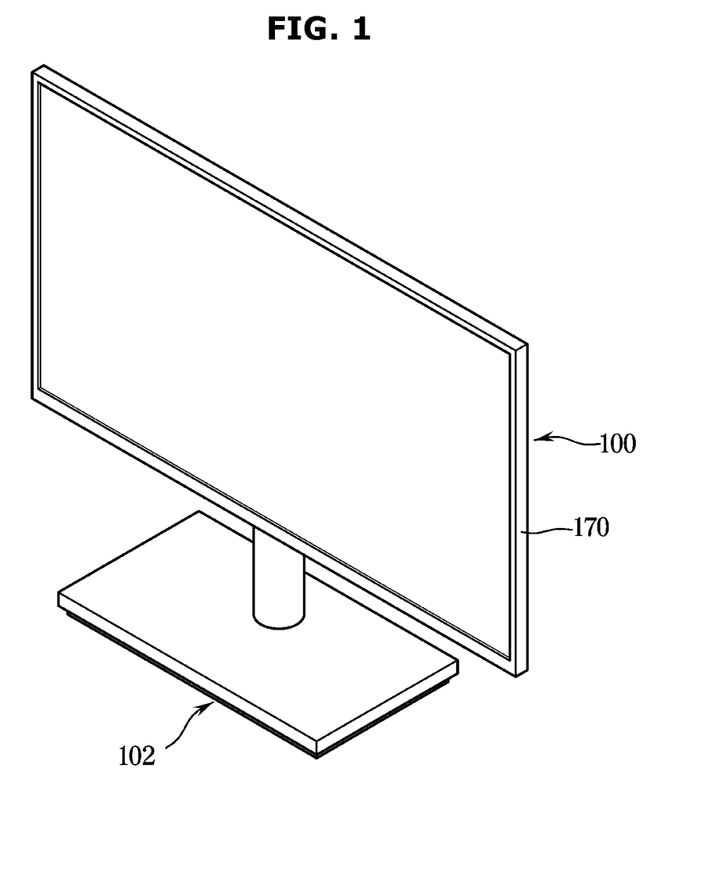
FIG. 1 is a view illustrating an exterior of a display apparatus according to an embodiment of the disclosure.
Figure 2:
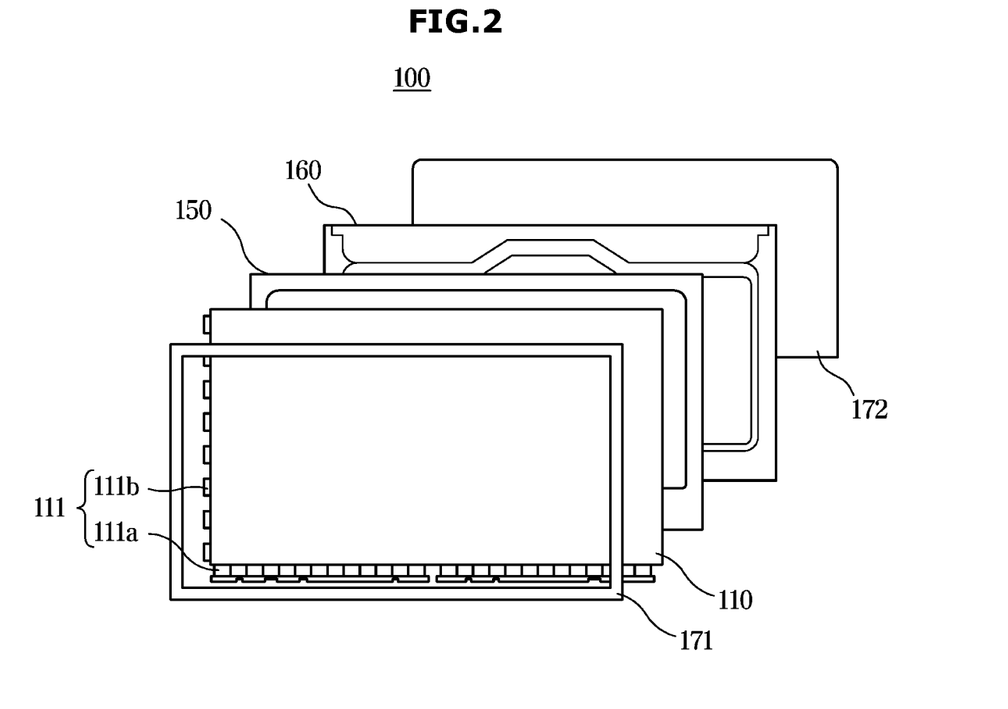
FIG. 2 is an exploded perspective view illustrating the display apparatus according to an embodiment of the disclosure.
Figure 3:
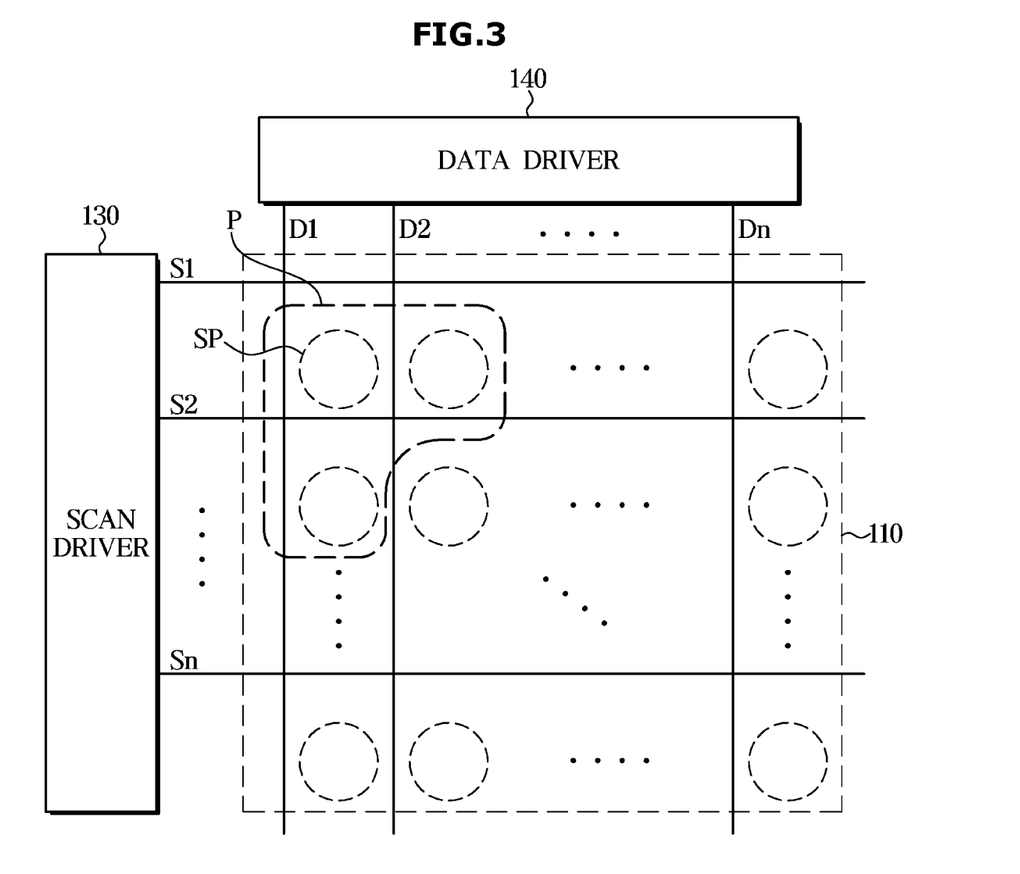
FIG. 3 is a view schematically illustrating a configuration of a display panel according to an embodiment of the disclosure.
Figure 4:
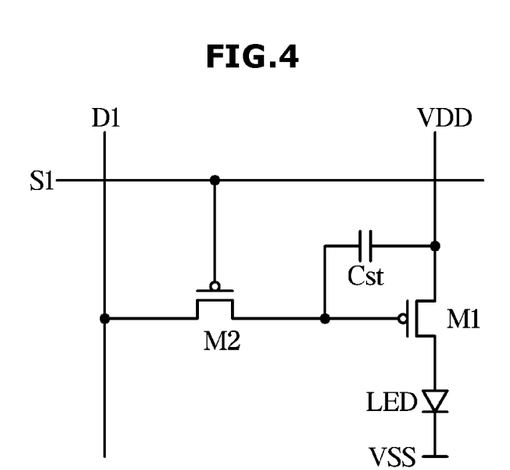
FIG. 4 is a circuit diagram illustrating a sub-pixel circuit provided in a sub-pixel region of the display panel of FIG. 3.
Figure 5:
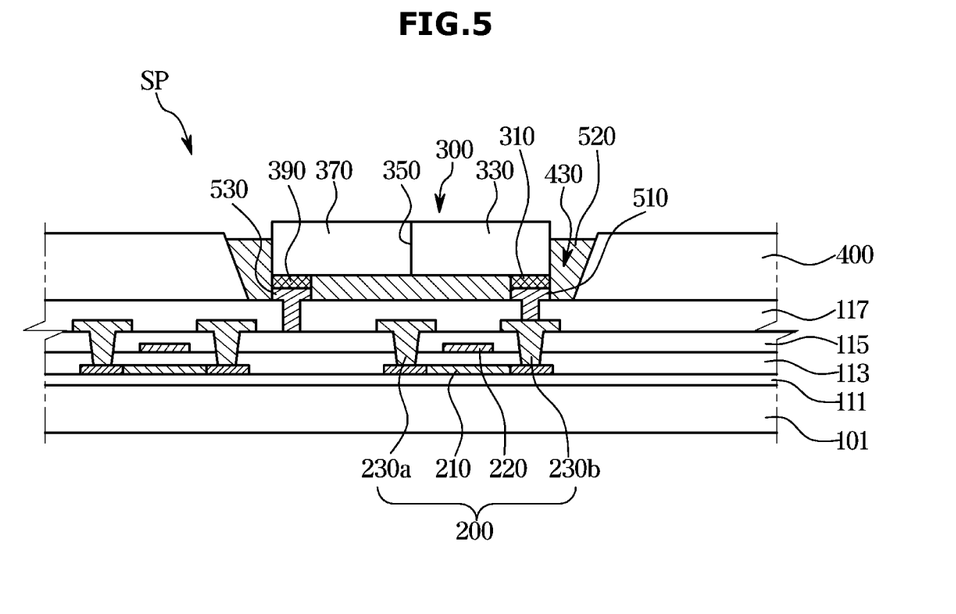
FIG. 5 is a plan view illustrating a layout structure of the sub-pixel region of the display panel of FIG. 3.

FIG. 1 is a view illustrating an exterior of a display apparatus according to an embodiment, FIG. 2 is an exploded perspective view illustrating the display apparatus according to an embodiment, FIG. 3 is a view schematically illustrating a configuration of a display panel according to an embodiment, FIG. 4 is a circuit diagram illustrating a sub-pixel circuit provided in a sub-pixel region of the display panel of FIG. 3, and FIG. 5 is a plan view illustrating a layout structure of the sub-pixel region of the display panel of FIG. 3.

A display apparatus 100 may display an image corresponding to an electric signal received from a source. The source of the image may be any source, including a transmitting apparatus broadcasting an image signal using terrestrial or satellite broadcasting, an apparatus transmitting an image signal over wire or fiber optics, such as a head end, an apparatus reading image data from a disk, such as a digital versatile disc (DVD) or hard disk, or an apparatus transmitting data over a network, such as a mobile device or a server transmitting or streaming video data to the display apparatus 100. Particularly, the display apparatus 100 may control color of each of a plurality of pixels of the image within a predetermined display region, to allow a user to recognize the display region as a single image.

In FIG. 1, an example is illustrated in which the display apparatus 100 is supported by a stand 102 mounted to a lower end of the display apparatus 100, is described. Alternatively, the display apparatus 100 may be installed on a wall by a bracket.

Referring to FIG. 2, the display apparatus 100 may include a display panel 110, a support member 150, a chassis 160, a bezel 171, and a cover 172.

The bezel 171 and the cover 172 may collectively form a housing that provides structure to support components of the display apparatus 100 and an external appearance of the display apparatus 100. The bezel 171 and the cover 172 may be coupled with each other to form an accommodating space within the display apparatus 100. The display panel 110, the support member 150, and the chassis 160 may be arranged within the accommodating space.

The support member 150 may support the display panel 110 and the chassis 160 arranged between the bezel 171 and the cover 172. For this, the support member 150 may be removably coupled to the bezel 171 to fix the display panel 110 and the chassis 160.

The chassis 160 may correspond to a panel connecting a variety of components utilized for displaying an image display and outputting sound. A variety of printed circuit board and input and output devices may be disposed on the chassis 160. Therefore, the chassis 160 may be formed of metal having excellent heat dissipation and excellent strength.

The display panel 110 may be a panel emitting light having a frequency corresponding to an image signal, which is received from an external image source or generated in the display apparatus 100, to allow a user to visually recognize an image.

For this, the display panel 110 may include a substrate and a plurality of inorganic light emitting diodes (LEDs) 300. An electrode pattern 111, which is generated by a scan line 111b and a data line 111a having a configuration in which the data line 111a and the scan line 11b cross to each other, is provided on the substrate. Each LED 300 among the plurality of inorganic LEDs 300 is bonded to the electrode pattern 111 of the substrate.

Referring to FIG. 3, a data line D1-Dn, a scan line S1-Sn and a sub-pixel circuit in a plurality of sub-pixel regions SP may be provided as the electrode pattern on one surface of the display panel 110. Sub-pixel region SP may represent a region that is adjacent to an intersection between the data line D1-Dn and the scan line S1-Sn, and that is provided with the sub-pixel circuit. The plurality of sub pixel regions SP may be grouped into pixel regions, and one color represented by the corresponding pixel may be selected by mixing the respective light of the plurality of sub pixel regions SP generated in one pixel region P.

The data lines D1 to Dn may transmit a data signal representing an image signal to the sub pixel circuits in the sub pixel region SP, and the scan lines S1 to Sn may transmit a scan signal to the sub pixel circuits in the sub pixel region SP.

Utilizing a scan driver 130, the scan signal may be sequentially applied to each of the plurality of scan lines S1-Sn arranged in the row direction, and by a data driver 140, the data voltage (VDATA) corresponding to the image signal may be applied to the plurality of data lines 1l-Dn arranged in the column direction.

The scan driver 130 and/or the data driver 140 may be electrically connected to the display panel 110, or may be mounted to a tape carrier package (TCP), which is bonded to the display panel 110 and then electrically connected to the display panel 110, in the form of a chip. Alternatively, the scan driver 130 and/or the data driver 140 may be mounted to a Flexible Printed Circuit (FPC) or film, which is bonded to the display panel 110 and then electrically connected to the display panel 110, in the form of a chip. In addition, the scan driver 130 and/or the data driver 140 may be directly mounted to the substrate of the display panel.

FIG. 4 is an equivalent circuit diagram of the sub-pixel circuit in the sub pixel region SP of FIG. 3. Particularly, FIG. 4 illustrates a sub-pixel circuit driven by a first scan line S1 and a first data line D1.

Referring to FIG. 4, the sub-pixel circuit may include an inorganic light emitting diode (LED), two transistors M1 and M2, and a capacitor Cst. The plurality of transistors M1 and M2 may be provided as PMOS transistors. However, the transistors M1 and M2 may be implemented as NMOS transistors or a combination of NMOS and PMOS transistors, and such a circuit configuration of FIG. 4 is merely an example of the sub-pixel circuit, and the configuration of the sub-pixel circuit is not limited to the exact circuit configuration of FIG. 4.

With respect to switching transistor M2, a gate electrode may be connected to the scan line S1, a source electrode may be connected to the data line D1, a drain electrode may be connected to one end of the capacitor Cst and a gate electrode of a driver transistor M1. The other end of the capacitor Cst may be connected to a power voltage VDD. As for the driver transistor M1, a source electrode may be connected to the power voltage VDD, and a drain electrode may be connected to an anode 310 (refer to FIG. 5) of the inorganic LED. A cathode 390 (refer to FIG. 5) of the inorganic LED may be connected to a reference voltage VSS, and thus the inorganic LED may emit light based on the current applied from the driver transistor M1. The reference voltage VSS connected to the cathode 390 of the inorganic LED may be lower than the power voltage VDD and thus a ground voltage may be used as the reference voltage VSS.

An operation of the sub-pixel circuit is as follows. First, when the scan signal is applied to the scan line Sn and the switching transistor M2 is turned on, the data voltage on the data line Dn may be transmitted to one end of the capacitor Cst and the gate electrode of the driver transistor M1. As a result, a gate-source voltage VGS of the driver transistor M1 may be maintained for a predetermined period of time, by the capacitor Cst. In addition, the driver transistor M1 may allow the inorganic LED to emit light by applying a current ILED corresponding to the gate-source voltage VGS of the driver transistor M1 to the anode 310 of the inorganic LED.

When a high data voltage VDATA is transmitted to the gate electrode of the driver transistor M1, the gate-source voltage VGS of the driver transistor M1 may be lowered. Accordingly, a small amount of current ILED may be applied to the anode 310 of the inorganic LED and thus the inorganic LED may emit less light. Therefore, the inorganic LED may display a low gradation. On the other hand, when a low data voltage VDATA is transmitted to the gate electrode of the driver transistor M1, the gate-source voltage VGS of the driver transistor M1 may be increased. Accordingly, a large amount of current ILED may be applied to the anode 310 of the inorganic LED and thus the inorganic LED may emit more light. Therefore, the inorganic LED may display a high gradation. Thus, a level of data voltage VDATA applied to each sub pixel circuits may be selected based on an image to be displayed.

FIG. 5 illustrates an example of a cross-section of the sub pixel region SP. FIG. 5 illustrates a configuration in which one of two transistors 200 is connected to the inorganic LED 300.

The substrate 101 may include various materials. For example, the substrate 101 may be formed of a transparent glass material containing SiO2 as a main component, but the composition of the substrate 101 is not limited thereto. For example, the substrate 101 may be formed of transparent plastic material, and thus the substrate 101 may have flexibility. The plastic material may be an insulating organic material selected from a group consisting of polyethersulphone (PES), polyacrylate (PAR), polyetherimide (PEI), polyethyelenenaphthalate (PEN), polyethylene terephthalate (PET), polyphenylene sulfide (PPS), polyallylate, polyimide, polycarbonate (PC), cellulose triacetate (TAC), and cellulose acetate propionate (CAP).

When the display apparatus is a bottom emission type in which an image to be displayed is implemented to a direction of the substrate 101, the substrate 101 may be formed of a transparent material. On the other hand, when the display apparatus is a top emission type in which an image to be displayed is implemented to a direction opposite to the substrate 101, the substrate 101 may not be formed with a transparent material. In this case, the substrate 101 may be formed of metal.

When the substrate 101 is formed of metal, the substrate 101 may include at least one selected from a group consisting of iron, chromium, manganese, nickel, titanium, molybdenum, stainless steel (SUS), Invar alloy, Inconel alloy and kovar alloy, but the composition of the substrate 101 is not limited thereto.

A buffer layer 111 may be formed on the substrate 101. The buffer layer 111 may provide a flat surface on the top of the substrate 101 and may prevent foreign materials or moisture from penetrating through the substrate 101. For example, the buffer layer 111 may be formed of an inorganic material such as silicon oxide, silicon nitride, silicon oxynitride, aluminum oxide, aluminum nitride, titanium oxide or titanium nitride, or an organic material such as polyimide, polyester, or acrylic. Alternatively, the buffer layer 111 may be formed by a plurality of laminated layers of the above-mentioned materials.

The transistor 200 and the inorganic LED 300 may be disposed on the buffer layer 111.

The transistor 200 may include an active layer 210, a gate electrode 220, a source electrode 230a and a drain electrode 230b. The active layer 210 may include a semiconductor material, and the active layer 210 may have a source region, a drain region, and a channel region between the source region and the drain region. The gate electrode 220 may be formed on the active layer 210 corresponding to the channel region. The source electrode 230a and the drain electrode 230b may be electrically connected to the source region and the drain region of the active layer 210, respectively. A first insulating layer 113 formed of an inorganic insulating material may be arranged as a gate insulating film between the active layer 210 and the gate electrode 220. A second insulating layer 115 may be arranged as an interlayer insulating film between the gate electrode 220 and the source electrode 230a and between the gate electrode 220 and the drain electrode 230b. A third insulating layer 117 may be arranged as a planarization film on the source electrode 230a and the drain electrode 230b. The second insulating layer 115 and the third insulating layer 117 may be formed of an organic insulating material or an inorganic insulating material. Alternatively, the second insulating layer 115 and the third insulating layer 117 may be formed by alternating the organic insulating material and the inorganic insulating material.

FIG. 5 illustrates that the transistor 200 is implemented as a top gate type in which a gate electrode 220 is arranged on top of the active layer, but is not limited thereto. Therefore, the gate electrode may be arranged below the active layer.

A bank 400 defining the sub-pixel region SP may be arranged on the third insulating layer 117. The bank 400 may include a concave portion 430, such as a well or depression, in which the inorganic LED 300 is to be accommodated. A height of the bank 400 may be selected based on a height and a viewing angle of the inorganic LED 300. A size (width) of the concave portion 430 may be selected based on resolution and pixel density of the display apparatus 100. According to an embodiment, the height of the inorganic LED 300 may be greater than the height of the bank 400. FIG. 5 illustrates that the concave portion 430 is configured as a square shape, but the configuration of the concave portion 430 is not limited thereto, and the concave portion 430 may have various shapes such as a polygonal shape, a rectangular shape, a circular shape, a conical shape, an elliptical shape and a triangle shape.

A signal electrode 510 may be arranged along a side surface and a bottom surface of the concave portion 430 and an upper surface of the bank 400 around the concave portion 430. The signal electrode 510 may be electrically connected to the source electrode 230a or the drain electrode 230b of the transistor 200 through a via hole formed through the third insulating layer 117. FIG. 5 illustrates that the signal electrode 510 is electrically connected to the drain electrode 230b.

The bank 400 may act as a light blocking portion having a low light transmittance to block light emitted in a direction towards the side surface of the inorganic LED 300. Therefore, the bank 400 may prevent light emitted from adjacent inorganic LEDs 300 from being mixed, and therefore mixing of light colors may be reduced. In addition, the bank 400 may improve bright room contrast of the display apparatus 100 by absorbing and blocking the light incident from the external environment of the display apparatus 100. The bank 400 may include a material that absorbs at least some beams of the light, or a light reflective material, or a light scattering material.

The bank 400 may include a semi-transparent or opaque insulating material for visible light (e.g., light in a wavelength range of from 380 nm to 750). The bank 400 may be formed of thermoplastic resin such as polycarbonate (PC), polyethylene terephthalate (PET), polyethersulfone, polyvinyl butyral, polyphenylene ether, polyamide, polyether imide, norbornene system resin, methacrylic resin, or cyclic polyolefin-based resin, thermosetting resin such as an epoxy resin, a phenol resin, a urethane resin, an acrylic resin, a vinyl ester resin, an imide-based resin, a urethane-based resin, a urea resin or a melamine resin, and organic insulating material such as polystyrene, polyacrylonitrile, or polycarbonate, but the composition of the bank 400 is not limited thereto.

Alternatively, the bank 400 may be formed of an inorganic insulating material such as an inorganic oxide such as SiOx, SiNx, SiNxOy, AlOx, TiOx, TaOx, or ZnOx, or inorganic nitride, but the composition of the bank 400 is not limited thereto.

According to an embodiment, the bank 400 may be formed of an opaque material that is similar to or the same as a material of a black matrix. An insulating black matrix material may include resin or pastes including organic resins, glass pastes and black pigments, metal particles such as nickel, aluminum, molybdenum and alloys thereof, metal oxide particles (e.g., chromium oxide) or metal nitride particles (e.g., chromium nitride). According to an embodiment, the bank 400 may be a distributed bragg reflector (DBR) having high reflectivity or a mirror reflector formed of metal.

The inorganic LED 300 may be arranged on the concave portion 430 of the bank 400. The inorganic LED 300 may be a micro LED. Micro may indicate a size of 1 to 100 μm, but the dimension of the inorganic LED 300 is not limited thereto. Therefore, the inorganic LED 300 may have a size greater or less than the size of 1 to 100 μm. During assembly, the inorganic LED 300 may be individually or multiply picked up from the wafer by a transfer mechanism and transferred to the substrate 101 to be accommodated in the concave portion 430 of the substrate 101. According to an embodiment, the inorganic LED 300 may be accommodated in the concave portion 430 of the substrate 101 after the bank 400 and the signal electrode 510 are formed. The inorganic LED 300 may emit light of a predetermined wavelength within a wavelength range from ultraviolet light to visible light. For example, the inorganic LED 300 may be a red LED, green LED, blue LED, white LED, or UV LED.

The inorganic LED 300 may include a p-n diode, the anode 310 and the cathode 390. The anode 310 and/or the cathode 390 may be formed of a variety of conductive materials, including metals, conductive oxides and conductive polymers. The anode 310 may be electrically connected to the signal electrode 510, and the cathode 390 may be electrically connected to the common electrode 530. The p-n diode may include a p-doped portion 330 in the anode 310 side, one or more quantum well parts 350 and a n-doped portion 370 in the cathode 390 side. Alternatively, a doped portion in the cathode 390 side may correspond to the p-doped portion 330 and a doped portion in the anode 310 side may correspond to the n-doped portion 370.

A passivation layer 520 may be configured to surround the inorganic LED 300 in the concave portion 430. The passivation layer 520 may cover the bank 400 and the inorganic LED 300. The passivation layer 520 may include an organic insulating material. For example, the passivation layer 520 may be formed of acrylic, poly methyl methacrylate (PMMA), benzocyclobutene (BCB), polyimide, acrylate, epoxy and polyester, but the composition of the passivation layer 520 is not limited thereto.

Meanwhile, the inorganic LED 300 contained in the display apparatus 100 may emit light in a unique color. For example, referring to FIG. 6, the display apparatus 100 may include a sub-pixel region SP including an inorganic LED 300R emitting red light, a sub-pixel region SP including an inorganic LED 300G emitting green light, and a sub-pixel region SP including an inorganic LED 300B emitting blue light. The display apparatus 100 may group the sub-pixel region SP corresponding to the red light, the sub-pixel region SP corresponding to the green light and the sub-pixel region SP corresponding to the blue light, which sub-pixel regions are adjacent to each other, as a single pixel region P. Each of the plurality of inorganic LEDs 300R, 300G, and 300B contained in the single pixel region P may be connected to a corresponding one of the signal electrodes 510R, 510G, and 510B but the plurality of inorganic LEDs 300R, 300G, and 300B may share a single common electrode 530.

Meanwhile, a single pixel region may be provided as at least one of a pair of red inorganic LEDs, a pair of blue inorganic LEDs, and a pair of green inorganic LEDs.

Further, two or more inorganic LEDs having the same color region may be provided for each signal electrode.

The same color region may represent a color region commonly emitted by the plurality of inorganic LEDs. Particularly, the same color region may indicate at least one of a red region, a blue region and a green region.

When normal color light is not emitted from the pixel region P, a normal inorganic LED is bonded on the substrate to replace a defective inorganic LED among the plurality of inorganic LEDs in the corresponding pixel region P. For this, an electrode pattern may be configured such that the signal electrode 510 and the common electrode 530 have an additional region (hereinafter referred to as "replaceable region"). On the replaceable region, a replacement inorganic LED, which is to replace the defective inorganic LED, may be provided.

Figure 6:
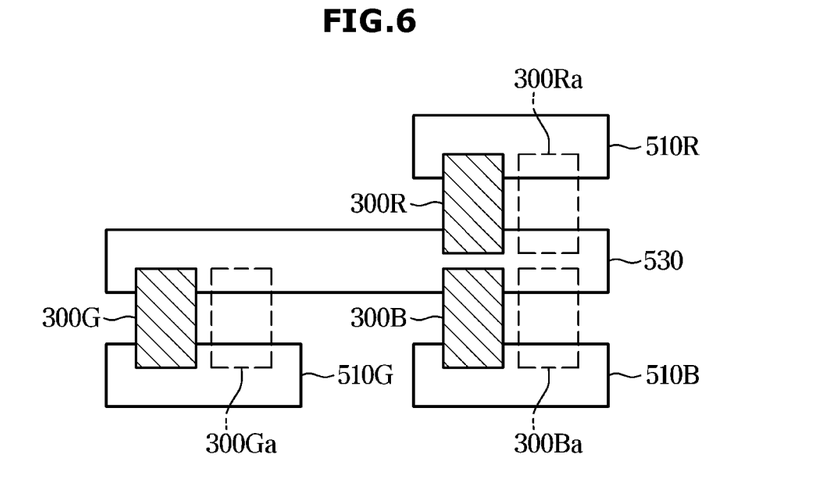
FIG. 6 is a plan view illustrating a pixel region according to an embodiment of the disclosure.
Figure 7:
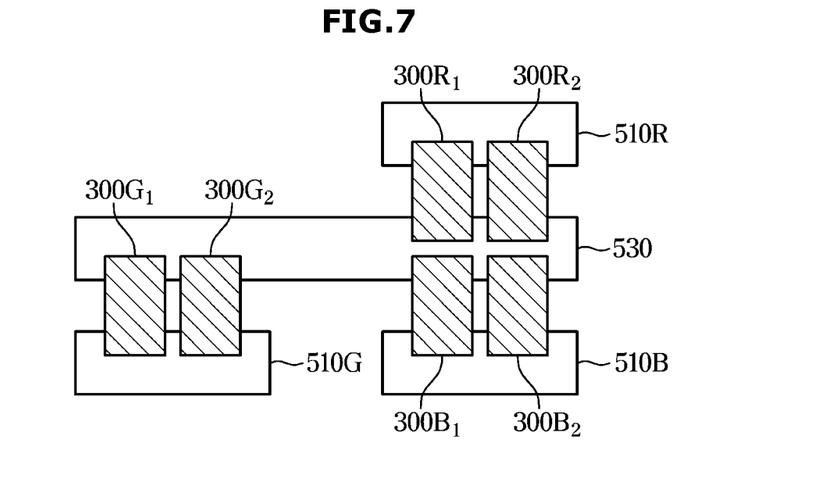
FIG. 7 is a plan view illustrating a pixel region according to an embodiment of the disclosure.
Figure 8:
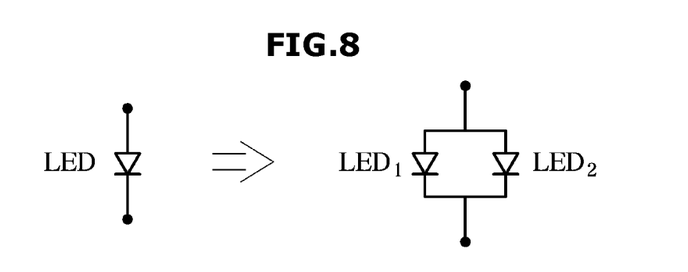
FIG. 8 is an equivalent circuit diagram of an inorganic light emitting diode (LED) contained in the sub-pixel region of FIG. 6 and FIG. 7.
Figure 9:
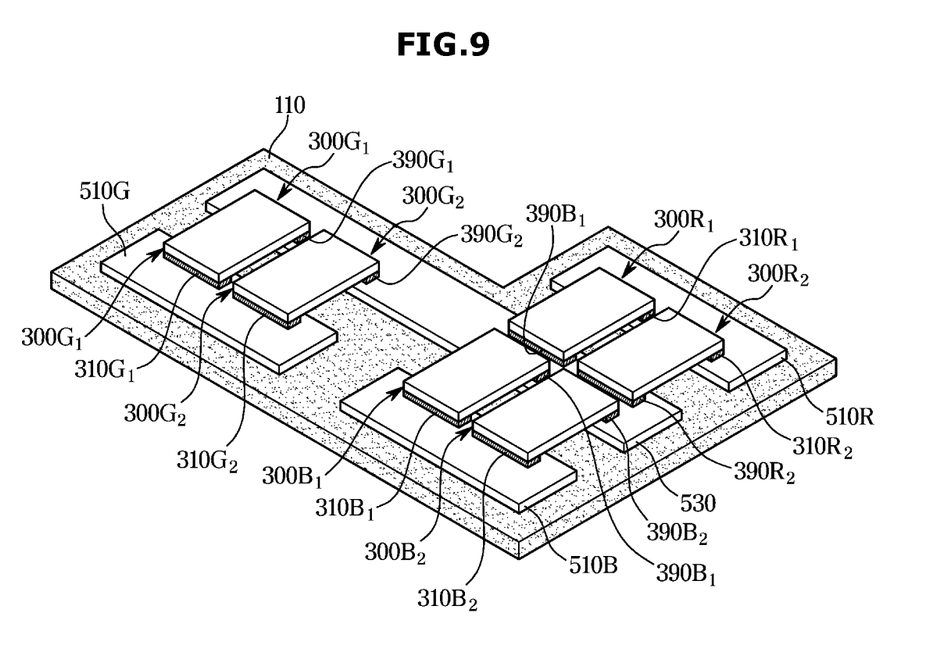
FIG. 9 is a perspective view illustrating a pixel region according to an embodiment.

FIG. 6 is a plan view illustrating a pixel region according to an embodiment of the disclosure, FIG. 7 is a plan view illustrating a pixel region according to an embodiment of the disclosure, FIG. 8 is an equivalent circuit diagram of n inorganic light emitting diode (inorganic LED) contained in the sub-pixel region of FIG. 6 and FIG. 7, and FIG. 9 is a perspective view illustrating a pixel region according to an embodiment.

In FIGS. 6 and 7, a sub-pixel region SP emitting red light, a sub-pixel region SP emitting green light, and a sub-pixel region SP emitting blue light form a single pixel region P.

Referring to FIG. 6, the single pixel region P on the display panel 110 includes a first signal electrode 510R connected to the anode 310 of the red inorganic LED 300R, a second signal electrode 510G connected to the anode 310 of the green inorganic LED 300G, a third signal electrode 510B connected to the anode 310 of the blue inorganic LED 300B, and a single common electrode 530 connected to all of a cathode 390 of the red inorganic LED 300R, a cathode 390 of the green inorganic LED 300G, and a cathode 390 of the blue inorganic LED 300B.

In this configuration, the common electrode 530 may be arranged a direction that is the same as orientations of the first signal electrode 510R, the second signal electrode 510G, and the third signal electrode 510B (for example, in a horizontal direction illustrated in FIG. 6). Particularly, the common electrode 530 may be arranged parallel and between the first signal electrode 510R and the third signal electrode 510B, and the first signal electrode 510R may be positioned above (in a vertical position illustrated in FIG. 6) an upper side the common electrode 530, and the second signal electrode 510G and the third signal electrode 510B may be positioned below a lower side of the common electrode 530, and thus the pixel region P may have an overall "J" shape.

Because the pixel region P has an "J" shape, the pixel region P may have a simple structure in comparison with a pixel region P in which a wiring structure of a circuit, which is connected signal electrodes 510R, 510G, and 510B or a common electrode 530, has a series connection.

The common electrode 530 and the first to third signal electrodes 510R, 510G, and 510B may be spaced apart from each other and may not electrically affect each other.

One end of the common electrode 530 and one end of the second signal electrode 510G may be aligned. The other end of the common electrode 530 and one end of the first signal electrode 510R and one end of the third signal electrode 510B may also be aligned. A length and a width of the common electrode 530 and the first to third signal electrodes 510R, 510G and 510B may be selected under conditions in which the inorganic LED 300R, 300G and 300B is arranged in the upper side and the inorganic LED 300R, 300G and 300B occupy a minimum area.

For example, a vertical width and a horizontal length of the common electrode 530 may be at least two times greater than a vertical width and a horizontal width of the first to third signal electrodes 510R, 510G, and 510B, respectively.

Meanwhile, a position of the first signal electrode 510R, a position of the second signal electrode 510G, and a position of the third signal electrode 510B may be switched to any position of FIG. 6. Therefore, FIG. 6 illustrates that a region in which the first signal electrode 510R is arranged in the right side of the common electrode 530, but the first signal electrode 510R may be arranged in the left side of the common electrode 530 (in this case, the common electrode 530 is arranged between the first signal electrode 510R and the second signal electrode 510G). However, for convenience of description, the description will be described with respect to the arrangement of FIG. 6.

In the first to third signal electrodes 510R, 510G and 510B, replaceable regions 300Ra, 300Ga and 300Ba of the inorganic LEDs 300R, 300G and 300B may be provided.

FIG. 6 illustrates that one of replaceable regions 300Ra, 300Ga, and 300Ba is provided for a corresponding one of the inorganic LEDs 300R, 300G, and 300B, but a plurality of replaceable regions 300Ra, 300Ga, and 300Ba may be further provided for each one of the inorganic LEDs 300R, 300G, and 300B.

A horizontal length of the first to third signal electrodes 510R, 510G and 510B may be at least two times greater than a horizontal length of the inorganic LEDs 300R, 300G and 300B so that the replaceable regions 300Ra, 300Ga and 300Ba are arranged in the first to third signal electrodes 510R, 510G and 510B.

Particularly, the horizontal length of the first signal electrode 510R may be at least two times greater than the horizontal length of the red inorganic LED 300R so that a first replaceable region 300Ra is provided in the first signal electrode 510R. The horizontal length of the second signal electrode 510G may be at least two times greater than the horizontal length of the green inorganic LED 300G so that a second replaceable region 300Ga is provided in the second signal electrode 510G. The horizontal length of the third signal electrode 510B may be at least two times greater than the horizontal length of the blue inorganic LED 300B so that a third replaceable region 300Ba is provided in the third signal electrode 510B.

A horizontal length of the common electrode 530 may be at least four times greater than a horizontal length of the inorganic LEDs 300R, 300G, and 300B so that at least two inorganic LEDs 300G and 300B and the replaceable regions 300Ga and 300Ba of the inorganic LEDs 300G and 300B are arranged in the common electrode 530.

As mentioned above, the replaceable regions 300Ra, 300Ga, and 300Ba may be provided in the signal electrodes 510R, 510G and 510B, and the common electrode 530. Therefore, when a defective inorganic LED is found, a new inorganic LED 300R, 300G, and 300B may be mounted in the replaceable regions 300Ra, 300Ga, and 300Ba without removing the defective inorganic LED during a repair process, and thus the defective inorganic LED is easily replaced.

Referring to FIG. 7, in the replaceable region 300Ra according to an embodiment, replacement inorganic LEDs $300R_2$, $300G_2$, $300B_2$ that can replace inorganic LEDs $300R_1$, $300G_1$ and $300B_1$ may be installed in advance to provide redundancy against potential failure of the inorganic LEDs $300R_1$, $300G_1$ and $300B_1$.

For convenience of description, the inorganic LEDs $300R_1$, $300G_1$ and $300B_1$ are referred to as a first inorganic LEDs $300R_1$, $300G_1$ and $300B_1$, and the replacement inorganic LEDs $300R_2$, $300G_2$ and $300B_2$ are referred to as a second inorganic LEDs $300R_2$, $300G_2$ and $300B_2$.

When the first inorganic LEDs $300R_1$, $300G_1$ and $300B_1$ and the second inorganic LEDs $300R_2$, $300G_2$ and $300B_2$ are provided for each sub-pixel region SP, as illustrated in FIG. 7, the first inorganic LEDs $300R_1$, $300G_1$ and $300B_1$ and the second inorganic LEDs $300R_2$, $300G_2$ and $300B_2$ may be connected in parallel as illustrated in the right side of FIG. 8.

FIG. 9 is a perspective view illustrating a pixel region according to an embodiment.

Referring to FIG. 9, each of the anodes $310R_1$, $310G_1$ and $310B_1$ of the first inorganic LEDs $300R_1$, $300G_1$ and $300B_1$, and each of the anodes $310R_2$, $310G_2$ and $310B_2$ of the second inorganic LEDs $300R_2$, $300G_2$ and $300B_2$ may be connected to a corresponding one of the signal electrodes 510R, 510G, 510B, and each of the anodes of the first inorganic LEDs $300R_1$, $300G_1$, $300B_1$ is connected in parallel with a corresponding one of the anodes of the second inorganic LEDs $300R_2$, $300G_2$ and $300B_2$. Each of the cathodes $390R_1$, $390G_1$ and $390B_1$ of the first inorganic LEDs $300R_1$, $300G_1$ and $310B_1$ and each of the anodes $390R_2$, $390G_2$ and $390B_2$ of the second inorganic LEDs $300R_2$, $300G_2$ and $300B_2$ may be connected to the common electrode 530 and each of the cathodes of the first inorganic LEDs $300R_1$, $300G_1$, $300B_1$ is connected in parallel with a corresponding one of the cathodes of the second inorganic LEDs $300R_2$, $300G_2$ and $300B_2$.

Because of the parallel connection, each of the first inorganic LEDs $300R_1$, $300G_1$, $300B_1$ and the second inorganic LEDs $300R_2$, $300G_2$ and $300B_2$ may have the same brightness as the inorganic LEDs 300R, 300G and 300B, as illustrated in FIG. 6, with the same voltage as the inorganic LEDs 300R, 300G and 300B.

However, the light of the first inorganic LEDs $300R_1$, $300G_1$, $300B_1$ and the light of the second inorganic LEDs $300R_2$, $300G_2$ and $300B_2$ are combined, and thus the entire brightness of the first inorganic LEDs $300R_1$, $300G_1$, $300B_1$ and the second inorganic LEDs $300R_2$, $300G_2$ and $300B_2$ may be greater than that of the single inorganic LEDs 300R, 300G and 300B.

Therefore, it is required to adjust the voltage of the first inorganic LEDs $300R_1$, $300G_1$, $300B_1$ and the voltage of the second inorganic LEDs $300R_2$, $300G_2$ and $300B_2$ so that the entire brightness of the first inorganic LEDs $300R_1$, $300G_1$, $300B_1$ and the second inorganic LEDs $300R_2$, $300G_2$ and $300B_2$ is the same as that of the single inorganic LEDs 300R, 300G and 300B.

Figure 10:
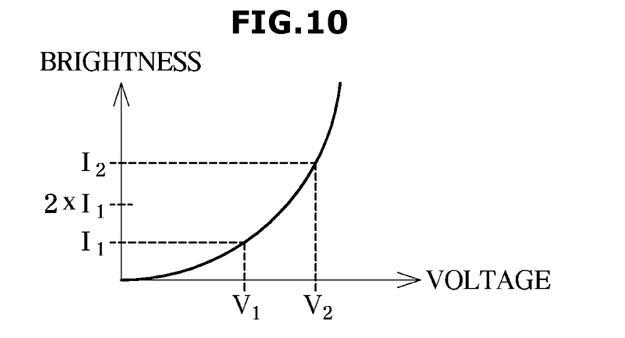
FIG. 10 is a graph illustrating brightness according to a voltage of a single inorganic LED.

FIG. 10 is a graph illustrating brightness according to a voltage of a single inorganic LED.

Referring to FIG. 10, an amount of change in the brightness according to the voltage of the inorganic LED increases as the voltage is increased. Accordingly, the brightness graph according to the voltage has an exponential curve shape instead of a straight line.

The brightness of the single inorganic LED is $I_2$ when the voltage $V_2$ is applied to the single inorganic LED. However, when the voltage $V_1$, which is a half of $V_2$, is applied to the first inorganic LED1 and the second inorganic LED2, respectively, the brightness of the first inorganic LED1 and the second inorganic LED2 is $I_1$, respectively. Accordingly, the entire brightness of the first inorganic LED1 and the second inorganic LED2 corresponds to two times of L1 ($=2*I_1$) and thus the entire brightness thereof ($2*I_1$) is lower than when the voltage $V_2$ is applied to the single inorganic LED, due to the curve characteristic of the graph.

Therefore, when the two inorganic LEDs LED1 and LED2 are connected in parallel with each other, an appropriate voltage $V_1$ applied to each inorganic LEDs $LED_1$ and $LED_2$ may be selected to allow twice the brightness $I_1$ of each of the inorganic LEDs $LED_1$ and $LED_2$ to be the same as the brightness $I_2$.

In addition, in a state in which two inorganic LEDs LED1 and LED2 are connected in parallel with each other, when a defective inorganic LED is found between the LED1 and the LED2, a user can maintain the same brightness by changing a voltage, which is applied to the normal inorganic LED (LED1 or LED2), to the voltage $V_2$ without removing the detective inorganic LED (LED1 or LED2).

In the above-described embodiment, the two inorganic LEDs LED1 and LED2 form a single sub-pixel region SP, but the configuration is not limited thereto. Three or more inorganic LEDs may be provided. When n-inorganic LEDs LED1 to LEDn are arranged in parallel with each other, an appropriate voltage applied to each of inorganic LEDs LED1 to LEDn may be selected to allow n-times the brightness $I_1$ of each of inorganic LEDs LED1 to LEDn to be the same as the brightness $I_2$.

Meanwhile, it has been described that the plurality of signal electrodes 510 surrounds the single common electrode 530 according to the above-mentioned embodiment, but the position of the signal electrode 510 and the position of the common electrode 530 may be switched. Alternatively, a plurality of common electrodes 530 may surround the signal electrode 510, and the cathode 390 of the inorganic LED 300 may be connected to the common electrode 530 and the anode 310 of the inorganic LED 300 may be connected to the signal electrode 510.

In response to the performance of the components of the display apparatus 100 as illustrated FIGS. 1 to 10, at least one component may be added or omitted. Further, it should be understood by those skilled in the art that the mutual position of the components can be changed corresponding to the performance or structure of the system.

According to a manufacturing of the display apparatus according to an embodiment, the signal electrode 510 and the common electrode 530 may be formed in the pixel region P of the substrate 101.

Next, the inorganic LED 300 (the first inorganic LED) may be picked up from a first wafer.

By such a mounting process, the anode 310 and the cathode 390 of the LED may be connected to the signal electrode 510 and the common electrode 530, respectively, in the pixel region.

According to an embodiment, when the previously picked inorganic LED 300 is referred to as the first inorganic LED, the first inorganic LED may be mounted to the display panel 110 and then the second inorganic LED may be picked up from another wafer (hereinafter it is referred to as a second wafer), which is different from the wafer (hereinafter it is referred to as a first wafer) on which the first inorganic LED is disposed.

By the mounting process, the anode 310 and the cathode 390 of the inorganic LED may be connected to the signal electrode 510 and the common electrode 530, respectively, in the pixel region.

As is apparent from the above description, by using the display apparatus and the manufacturing method of the same, when a defective inorganic LED is found in a minimal pixel region, the detective inorganic LED may be easily replaced with a normal inorganic LED because a plurality of inorganic LEDs of the same color is mounted in the pixel region. Accordingly, it may be possible to minimize the reduction in the blocking area caused by the black matrix and thus it may be possible to minimize the reduction in the contrast ratio of the display apparatus.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a plurality of non-replacement inorganic light emitting diodes included in a single pixel region, the plurality of non-replacement inorganic light emitting diodes comprising a red non-replacement inorganic light emitting diode, a green non-replacement inorganic light emitting diode, and a blue non-replacement inorganic light emitting diode;
a plurality of replacement inorganic light emitting diodes comprising a red replacement inorganic light emitting diode corresponding to the red non-replacement inorganic light emitting diode, a green replacement inorganic light emitting diode corresponding to the green non-replacement inorganic light emitting diode, and a blue replacement inorganic light emitting diode corresponding to the blue non-replacement inorganic light emitting diode;
a plurality of signal electrodes comprising a first signal electrode connected to supply first data signals to the red non-replacement inorganic light emitting diode and the red replacement inorganic light emitting diode, a second signal electrode connected to supply second data signals to the green non-replacement inorganic light emitting diode and the green replacement inorganic light emitting diode, and a third signal electrode connected to supply third data signals to the blue non-replacement inorganic light emitting diode and the blue replacement inorganic light emitting diode;
a common electrode configured to provide a ground to the plurality of non-replacement inorganic light emitting diodes and the plurality of replacement inorganic light emitting diodes; and
a data driver configured to apply voltage to the plurality of non-replacement inorganic light emitting diodes and the plurality of replacement inorganic light emitting diodes such that an entire brightness of a combination of the red non-replacement inorganic light emitting diode and the red replacement inorganic light emitting diode is the same as a brightness of the red non-replacement inorganic light emitting diode while operating both the red non-replacement inorganic light emitting diode and the red replacement inorganic light emitting diode, an entire brightness of a combination of the green non-replacement inorganic light emitting diode and the green replacement inorganic light emitting diode is the same as a brightness of the green non-replacement inorganic light emitting diode while operating both the green non-replacement inorganic light emitting diode and the green replacement inorganic light emitting diode, and an entire brightness of a combination of the blue non-replacement inorganic light emitting diode and the blue replacement inorganic light emitting diode is the same as a brightness of the blue non-replacement inorganic light emitting diode while operating both the blue non-replacement inorganic light emitting diode and the blue replacement inorganic light emitting diode.

2. The display apparatus of claim 1, wherein the second signal electrode is arranged on a left side of the single pixel region and the third signal electrode is arranged on a right side of the single pixel region, and the common electrode is arranged between the first signal electrode and the third signal electrode.

3. The display apparatus of claim 1, wherein the plurality of signal electrodes have a same horizontal length as each other.

4. The display apparatus of claim 3, wherein a horizontal length of the common electrode is at least two times greater than the horizontal length of the plurality of signal electrodes.

5. The display apparatus of claim 1, wherein a vertical width of the common electrode is at least two times greater than a vertical width of the plurality of signal electrodes.

6. The display apparatus of claim 1, wherein the plurality of non-replacement inorganic light emitting diodes, the plurality of replacement inorganic light emitting diodes, the plurality of signal electrodes, and the common electrode are included in the single pixel region.

7. The display apparatus of claim 1, wherein the single pixel region comprises a single common electrode, and the single pixel region is composed of a first pair of the red non-replacement inorganic light emitting diode and the red replacement inorganic light emitting diode, a second pair of the blue non-replacement inorganic light emitting diode and the blue replacement inorganic light emitting diode, and a third pair of the green non-replacement inorganic light emitting diode and the green replacement inorganic light emitting diode.

8. The display apparatus of claim 1, further comprising:
a substrate comprising a plurality of scan lines and a plurality of data lines provided on one surface of the substrate,
wherein the plurality of non-replacement inorganic light emitting diodes, the plurality of replacement inorganic light emitting diodes, the plurality of signal electrodes, and the common electrode are included in the single pixel region, and
wherein the single pixel region comprises a plurality of sub-pixel regions formed at intersections of the plurality of scan lines and the plurality of data lines.

9. The display apparatus of claim 1, wherein the plurality of non-replacement inorganic light emitting diodes and the plurality of replacement inorganic light emitting diodes are bonded to the plurality of signal electrodes and the common electrode.

10. The display apparatus of claim 8, wherein the single pixel region comprises three sub-pixel regions adjacent to each other, and the three sub-pixel regions are composed of a first pair of the red non-replacement inorganic light emitting diode and the red replacement inorganic light emitting diode, a second pair of the blue non-replacement inorganic light emitting diode and the blue replacement inorganic light emitting diode, and a third pair of the green non-replacement inorganic light emitting diode and the green replacement inorganic light emitting diode, respectively.

\* \* \* \* \*